Aug. 7, 1962 J. P. GREENING 3,048,817

GAIN CONTROL AMPLIFIER

Filed Jan. 16, 1958 3 Sheets-Sheet 1

INVENTOR.
J. P. GREENING

BY Hudson & Young

ATTORNEYS

INVENTOR.
J.P. GREENING

BY Hudson & Young

ATTORNEYS

Aug. 7, 1962 J. P. GREENING 3,048,817

GAIN CONTROL AMPLIFIER

Filed Jan. 16, 1958 3 Sheets-Sheet 3

INVENTOR.
J. P. GREENING
BY Hudson & Young
ATTORNEYS

United States Patent Office 3,048,817

Patented Aug. 7, 1962

3,048,817
GAIN CONTROL AMPLIFIER

John P. Greening, Bartlesville, Okla., assignor to Phillips Petroleum Company, a corporation of Delaware Filed Jan. 16, 1958, Ser. No. 709,282
4 Claims. (Cl. 340—15.5)

This invention relates to apparatus for controlling the gain of amplifiers in a preselected manner.

In geophysical prospecting, valuable information can often be obtained concerning subsurface formations by means of seismic surveys. A plurality of vibration responsive devices are positioned at or near the surface of the earth in a predetermined geometric array and an explosive is detonated at a region spaced therefrom. Vibrations emitted from the explosive charge travel downwardly into the earth and are reflected from various formations back to the vibration responsive devices. These vibration responsive devices establish electrical signals which are representative of the vibrations incident thereon, which signals are amplified and applied to a recording instrument. By observing the times of arrival of the reflections at the various locations, it is possible to obtain information regarding the depth and dip of subsurface formations.

In making records of this type it is often necessary to vary the gain of the amplifiers with respect to time because of large variations in signal amplitude between the beginning and end of the record. This can be accomplished by having the average signal level control the gain of the amplifiers. However, if such an average gain control is applied to the first stages of the amplifier, the gain is often controlled by low frequencies which are not produced by reflections and which are later removed by filtering. This produces undesirable fluctuations in the gain. If filters are placed before the automatic gain controller to remove these low frequencies, the signal amplitude may become so large that it is difficult to design input and filter stages which do not over load. These difficulties can be overcome by using a programmed gain controller in which the gain of the amplifier is varied in a predetermined manner as a function of time. However, the programmed gain controllers employed heretofore have been decidedly limited in the manner by which the gain can be regulated. These control systems generally have been able to increase the gain only exponentially with respect to time.

In accordance with the present invention there is a novel amplifier gain control system wherein the gain of the amplifier is controlled in a preselected manner. A function generator is employed to establish an electrical signal of a relatively high frequency which varies in amplitude in accordance with the desired manner by which the gain of the amplifier is to be varied. This signal is added to the seismic signal to be recorded, and the combined signals are amplified. The amplified signal is applied through a low pass filter to a recorder so that the recorded signal is representative of only the output signal of the seismometer. The output signal of the amplifier is also passed through a second filter which transmits frequencies corresponding to the frequency of the gain control signal. The output of the second filter is compared with a reference potential, and any difference therebetween is applied through a servo system to control the gain of the amplifier. In this manner, the gain of the amplifier can be regulated in any selected manner as a function of time.

Accordingly, it is an object of this invention to provide improved apparatus to control the gain of an amplifier as a function of time.

Another object is to provide a seismic recording system wherein the amplitude of the recorded seismic signal is varied in a preselected manner as a function of time.

Other objects, advantages and features of the invention should become apparent from the following detailed description which is taken in conjunction with the accompanying drawing in which.

Figure 1:
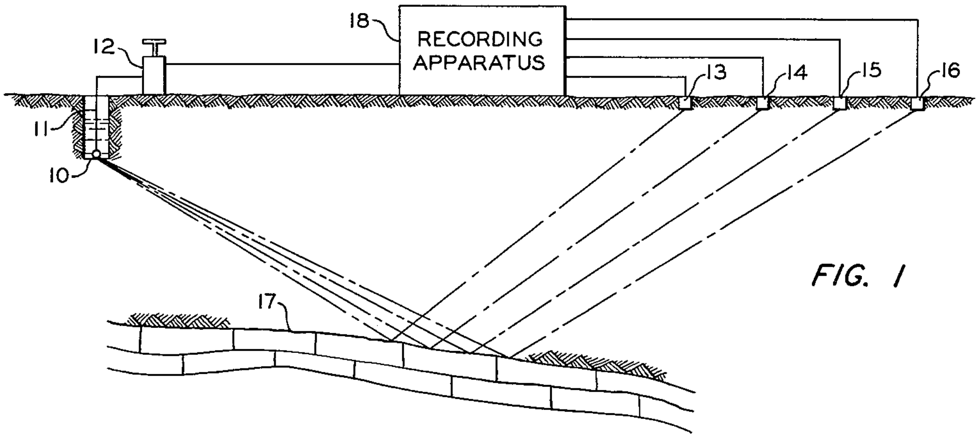
FIGURE 1 is a schematic representation of a typical seismic exploration system having the recording device of this invention associated therewith.

Referring now to the drawing in detail and to FIGURE 1 in particular, there is shown an explosive charge 10 which is positioned in a shot hole 11. Charge 10 is connected to a detonator 12. A plurality of seismometers 13, 14, 15 and 16 are positioned near the surface of the earth in spaced relationship with one another and with shot hole 11. Vibrations emitted from explosive charge 10 travel downwardly into the earth and are reflected upwardly by a subterranean reflecting bed 17 and are received by the several seismometers as illustrated. The seismometers provide electrical signals which are representative of the vibrations incident thereon. These signals are applied to the recording apparatus 18 of the present invention. Detonator 12 is also connected to recorder 18 to establish a signal representative of the time at which the explosive charge is detonated.

Figure 2:
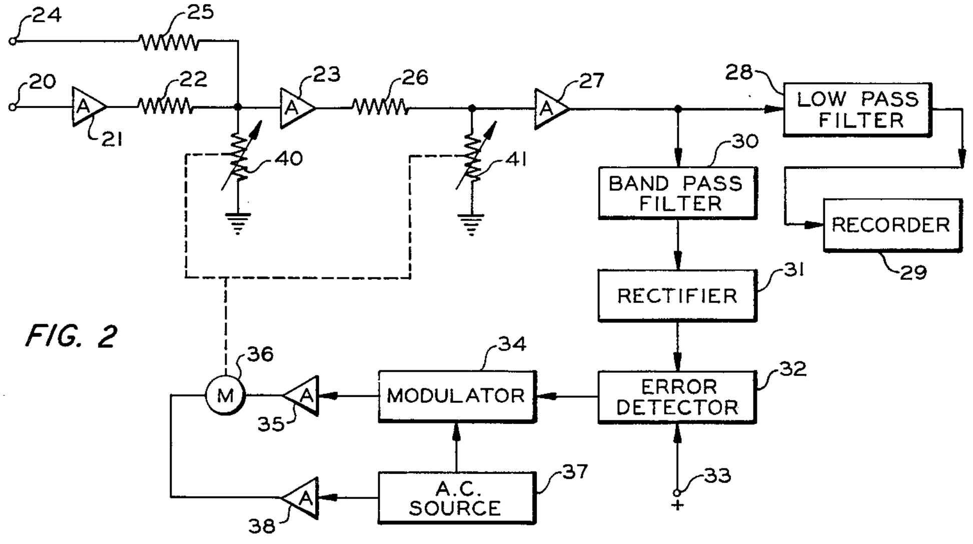
FIGURE 2 is a schematic circuit drawing of a first embodiment of the amplifier gain control system of this invention.

The recording apparatus of this invention is illustrated schematically in FIGURE 2. Input terminal 20 represents an output terminal of one of the individual seismometers. This terminal is connected through an amplifier 21 and a resistor 22 to the input of a second amplifier 23. A second input terminal 24 is connected to the input of amplifier 23 through a resistor 25. Terminal 24 represents an output terminal of a signal generator which is described in detail hereinafter. This generator establishes an alternating signal of a relatively high frequency, 1500 cycles per second, for example, the amplitude of which is representative of the desired gain of the amplifying system. The output of amplifier 23 is connected through a resistor 26 to the input of an amplifier 27. The output of ampifier 27 is connected through a low pass filter network 28 to a recorder 29. Filter network 28 is designed to transmit frequencies corresponding to the seismic variations, 100 cycles per second and less, for example. Filter network 28 does not transmit frequencies as high as the frequency of the signal applied to input terminal 24 so that only the amplified seismic signals are recorded.

The output of amplifier 27 is also applied through a band pass filter 30 and a rectifier 31 to the first input of an error detecting circuit 32. Filter 30 is designed to transmit frequencies corresponding to the frequency of the signal applied to terminal 24. A reference potential from a terminal 33 is also applied to error detecting circuit 32. Any difference between the two compared signals establishes an output signal which is applied through a modulator 34 and an amplifier 35 to the first input of a reversible servo motor 36. An alternating signal from a multiphase source 37 is applied to a second input of modulator 34 and through an amplifier 38 to the second input of motor 36. The drive shaft of motor 36 is connected to adjust resistors 40 and 41. Resistor 40 is connected between the input of amplifier 23 and ground, and resistor 41 is connected between the input of amplifier 27 and ground. These two resistors thus determine the gain of the amplifier by adjusting the amount of the input signal which is shunted to ground. Since the servo system responds solely to signals of the frequency of the signal applied to terminal 24, the gain of the amplifier is adjusted solely in response to the amplitude of this signal.

Figure 3:
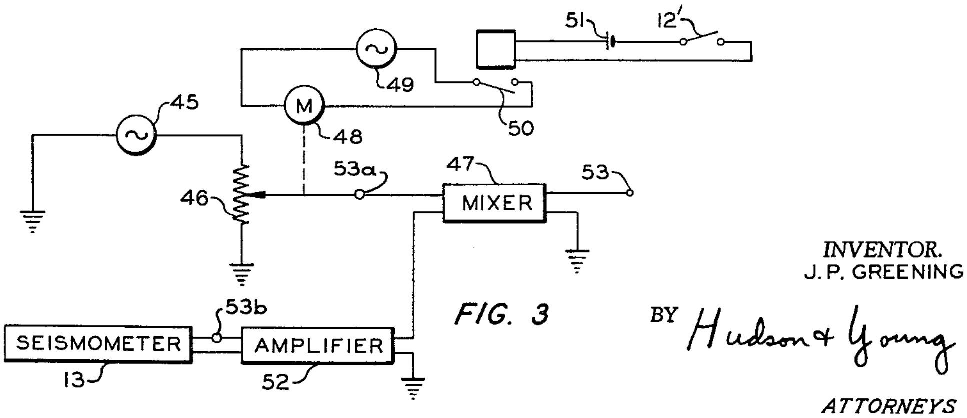
FIGURE 3 is a schematic circuit drawing of a first embodiment of a signal generator employed to establish the gain control signal in the apparatus of FIGURE 2.

A first embodiment of a suitable signal generator for controlling the gain of the amplifier is illustrated schematically in FIGURE 3. The first terminal of an alternating current source 45 is connected to the first terminal of a potentiometer 46. The second terminal of current source 45 and the second end terminal of potentiometer 46 are connected to ground. Current source 45 generates a signal of a relatively high frequency, such as 1500 cycles per second. The contactor of potentiometer 46 is connected to the first input terminal 53*a* of a mixer circuit 47. The contactor of potentiometer 46 is mechanically connected to the drive shaft of a motor 48 which is connected to a current source 49 through a relay operated switch 50. The coil of the relay is connected to a current source 51 through a switch 12' which is closed when detonator 12 is actuated. Closure of switch 12' thus energizes motor 48 to move the contactor of potentiometer 46. This potentiometer can be constructed so that the voltage at the contactor, with respect to ground, varies as a function of time in any preselected manner, thereby establishing the desired gain of the amplifier system. The output signal of one of the seismometers, such as 13, is applied through an amplifier 52 which has an input terminal 53*b* to the second input of mixer 47. The gain control signal and the seismometer signal are thus combined so that the output signal of mixer 47 represents the sum of these two signals. The first output terminal of mixer 47 is connected to a terminal 53 which corresponds to the input terminal of amplifier 23 of FIGURE 2.

Figure 4:
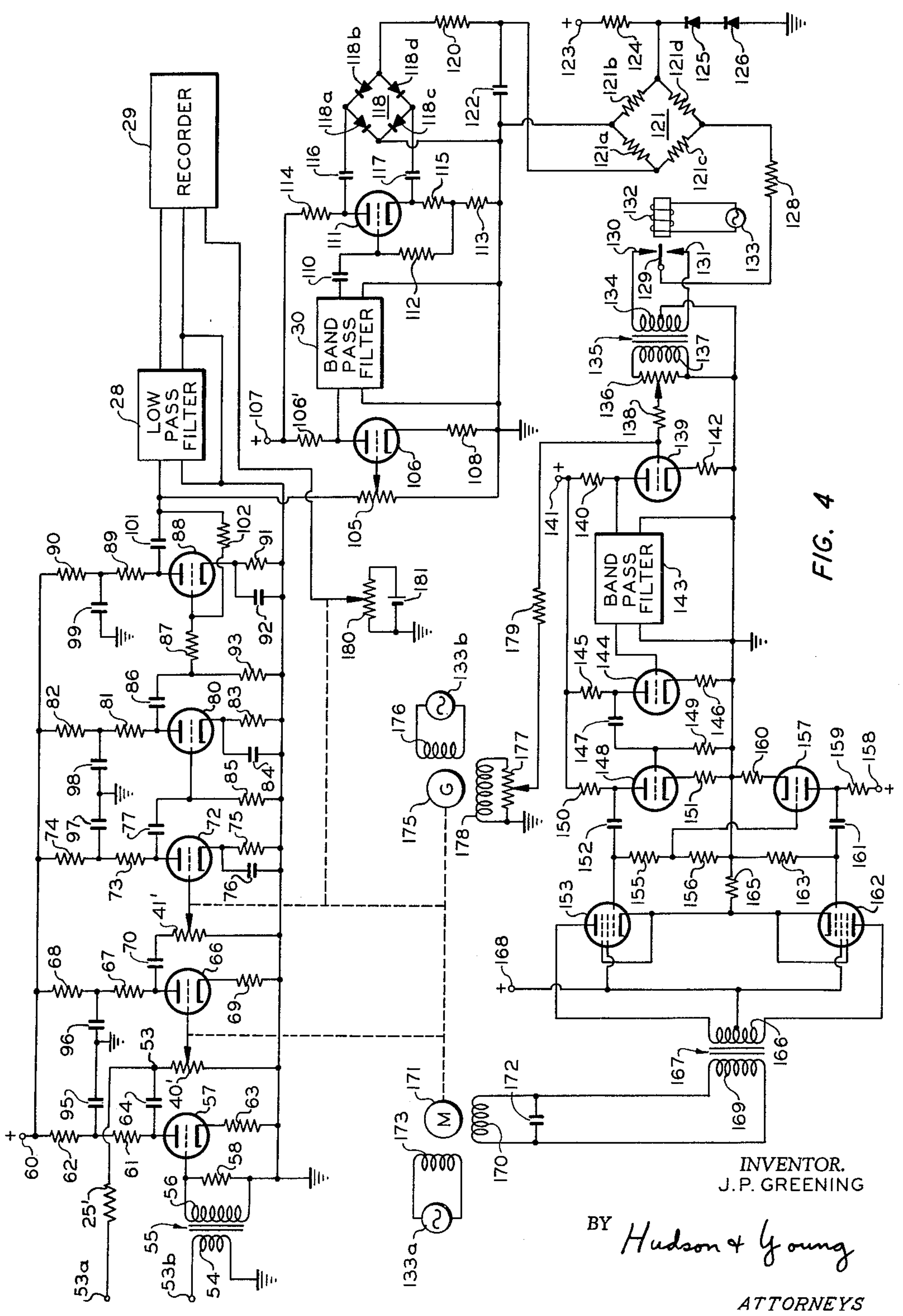
FIGURE 4 is a detailed circuit drawing of the apparatus of FIGURE 2.

A specific embodiment of the apparatus of FIGURE 2 is illustrated in detail in FIGURE 4. Input terminal 53*b* is connected to the first terminal of the primary winding 54 of a transformer 55, the second terminal of transformer winding 54 being connected to ground. The first terminal at the secondary winding 56 of transformer 55 is connected to the control grid of a triode 57, and the second terminal of winding 56 is connected to ground. The control grid of triode 57 is connected to ground through a resistor 58. The anode of triode 57 is connected to a positive potential terminal 60 through resistors 61 and 62, and the cathode of triode 57 is connected to ground through a resistor 63. The anode of triode 57 is also connected through a capacitor 64 to the first end terminal 53 of a potentiometer 40'. Input terminal 53*a* is connected through a resistor 25' to the first end terminal of potentiometer 40'. The second end terminal of potentiometer 40' is connected to ground, and the contactor thereof is connected to the control grid of a triode 66. The anode of triode 66 is connected to terminal 60 through resistors 67 and 68, and the cathode of triode 66 is connected to ground through resistor 69. The anode of triode 66 is also connected through a capacitor 70 to the first end terminal of a potentiometer 41'. The second end terminal of potentiometer 41' is connected to ground, and the contactor thereof is connected to the control grid of a triode 72. The anode of triode 72 is connected to terminal 60 through resistors 73 and 74, and the cathode of triode 72 is connected to ground through a resistor 75 which is shunted by a capacitor 76. The anode of triode 72 is also connected through a capacitor 77 to the control grid of a triode 80. The anode of triode 80 is connected to terminal 60 through resistors 81 and 82, and the cathode of triode 80 is connected to ground through a resistor 83 which is shunted by a capacitor 84. A resistor 85 is connected between the control grid of triode 80 and ground. The anode of triode 80 is also connected through a capacitor 86 and a resistor 87 to the control grid of a triode 88. The anode of triode 88 is connected to terminal 60 through resistors 89 and 90, and the cathode of triode 88 is connected to ground through a resistor 91 which is shunted by a capacitor 92. The junction between capacitor 86 and resistor 87 is connected to ground through a resistor 93. The junction between resistors 61 and 62 is connected to a ground through a decoupling capacitor 95; the junction between resistor 67 and 68 is connected to ground through a decoupling capacitor 96; the junction between resistor 73 and 74 is connected to ground through a decoupling capacitor 97; the junction between resistors 81 and 82 is connected to ground through a decoupling capacitor 98; and the junction between resistors 89 and 90 is connected to ground through a decoupling capacitor 99.

The circuit thus far described in FIGURE 4 corresponds to amplifiers 21, 23 and 27 and the associated circuit of FIGURE 2. The circuit of FIGURE 4 included between terminals 53*a*, 53*b* and 53 also corresponds to that between the same respective terminals of FIGURE 3. The incoming mixed signal is amplified by the 4-stage resistant-capacitance coupled amplifier. The gain of this amplifier can be adjusted by potentiometers 40' and 41' which correspond to schematic resistors 22 and 40, and 26 and 41, respectively, of FIGURE 2.

The anode of triode 88 is connected through a capacitor 101 to the first input terminal of low pass filter 28. The second input terminal of filter 28 is connected to ground. A feed-back resistor 102 is connected between the first input terminal of filter 28 and the control grid of triode 88. The output terminals of filter 28 are applied to recorder 29. As previously mentioned, filter 28 transmits frequencies corresponding to the seismic signal, but blocks frequencies corresponding to the output signal of the function generator of FIGURE 3.

The junction between capacitor 101 and the first input terminal of filter 28 is connected to the first end terminal of a potentiometer 105. The second end terminal of potentiometer 105 is connected to ground, and the contactor thereof is connected to the control grid of a triode 106. The anode of triode 106 is connected through a resistor 106' to a positive potential terminal 107, and the cathode of triode 106 is connected to ground through a resistor 108. The anode of triode 106 is also connected to the first input terminal of band pass filter 30, the second input terminal of which is connected to ground. The first output terminal of filter 30 is connected through a capacitor 110 to the control grid of a triode 111. The control grid of triode 111 is connected to ground through resistors 112 and 113. The anode of triode 111 is connected to terminal 107 through a resistor 114, and the cathode of triode 111 is connected to ground through series connected resistors 115 and 113. The anode and cathode of triode 111 are also connected through respective capacitors 116 and 117 to first opposite terminals of a full wave rectifier bridge network 118 formed by rectifiers 118*a*, 118*b*, 118*c* and 118*d*. The third terminal of bridge network 118 is connected to ground, and the fourth terminal is connected through a resistor 120 to the first terminal of a resistance bridge network 121. A capacitor 122 is connected between ground and the junction between resistor 120 and bridge network 121 formed by resistors 121*a*, 121*b*, 121*c* and 121*d*.

Band pass filter 30 is designed to transmit frequencies corresponding to the output signal of the function generator. The transmitted signal is rectified by network 118, and the rectified signal is filtered by resistor 120 and capacitor 122. The resulting potential is thus applied to the first input of resistance bridge network 121 which forms a portion of the error detector circuit of FIGURE 2.

A positive potential terminal 123 is connected through a resistor 124 and series connected rectifiers 125 and 126 to ground. The junction between resistor 124 and rectifier 125 is connected to the second terminal of bridge network 121 between resistors 121*b* and 121*d*. The third terminal of network 121 between resistors 121*a* and 121*c* is connected to ground, and the fourth terminal between resistors 121*c* and 121*d* is connected through a resistor 128 to the arm 129 of a chopper. A coil 132 is energized by an alternating current source 133 to move arm 129 to engage stationary contacts 130 and 131 alternately. The output signal of the bridge network is thus converted into a corresponding alternating signal by means of the chopper circuit. Terminals 130 and 131 are connected to the respective end terminals of the primary winding 134 of a transformer 135. The center tap of the primary winding 134 is connected to ground, as is one end terminal of the secondary winding 137 of transformer 135. A potentiometer 136 is connected across the secondary winding 137. The contactor of potentiometer 136 is connected through a resistor 138 to a control grid of a triode 139.

The anode of triode 139 is connected through a resistor 140 to a positive potential terminal 141, and the cathode of triode 139 is connected to ground through a resistor 142. The anode of triode 139 is also connected to the first input terminal of a band pass filter 143, the second input terminal of which is connected to ground. Filter 143 is designed to pass frequencies in a band which includes the frequency of current source 133, such as 400 cycles per second, for example. The first output terminal of filter 143 is connected to the control grid of a triode 144. The anode of triode 144 is connected to terminal 141 through a resistor 145, and the cathode of triode 144 is connected to ground through a resistor 146.

The anode of triode 144 is connected through a capacitor 147 to the control grid of a triode 148. The control grid of triode 148 is connected to ground through a resistor 149. The anode of triode 148 is connected to terminal 141 through a resistor 150, and the cathode of triode 148 is connected to ground through a resistor 151. The anode of triode 148 is also connected through a capacitor 152 to the control grid of a pentode 153. The control grid of pentode 153 is connected to ground through resistors 155 and 156. The junction between resistors 155 and 156 is connected to the control grid of a triode 157. The anode of triode 157 is connected to a positive potential terminal 158 through a resistor 159, and the cathode of triode 157 is connected to ground through a resistor 160. The anode of triode 157 is also connected through a capacitor 161 to the control grid of a second pentode 162. The control grid of pentode 162 is connected to ground through a resistor 163. The suppressor grids and cathodes of pentodes 153 and 162 are connected to ground through a common resistor 165. The anodes of pentodes 153 and 162 are connected to opposite end terminals of the primary winding 166 of a transformer 167. The screen grids of pentodes 153 and 162 are connected to the center tap of transformer winding 166 and to a positive potential terminal 168. The secondary winding of transformer 167 is connected across the first winding 170 of a reversible two-phase induction motor 171. A capacitor 172 is connected in parallel with motor winding 170. The second winding 173 of motor 171 is energized by a current source 133*a* which is of the same frequency but different phase than current source 133. The drive shaft of motor 171 is mechanically connected to the contactors of potentiometers 40′ and 41′ so that rotation of the motor adjusts the gain of the amplifier.

The drive shaft of motor 171 is also mechanically connected to a generator 175. The first winding 176 of generator 175 is energized by a current source 133*b* which is of the same frequency as but different phase than current sources 133 and 133*a*. However, the phase of the signal applied across winding 176 is shifted 90° from the phase of the signal applied across winding 173. A potentiometer 177, having one grounded end terminal, is applied across the second winding 178 of generator 175.

The contactor of potentiometer 177 is connected through a resistor 179 to the control grid of triode 139. Thus, a voltage is developed across potentiometer 177 which is representative of the speed of rotation of motor 171 and generator 175. A portion of this voltage is applied as negative feed-back to triode 139 to increase the stability of the servo system.

The drive shaft of motor 171 is also mechanically connected to the contactor of a potentiometer 180 which has a voltage source 181 connected across the end terminals thereof. One end terminal of potentiometer 180 is connected to ground. The contactor of potentiometer 180 is connected to a second channel of recorder 29. This provides a record of the adjustment of the amplifier gain as a function of time. The gain adjustment is recorded adjacent the amplified seismic signal so that the true signal can readily be obtained from a comparison of the two records.

Figure 5:
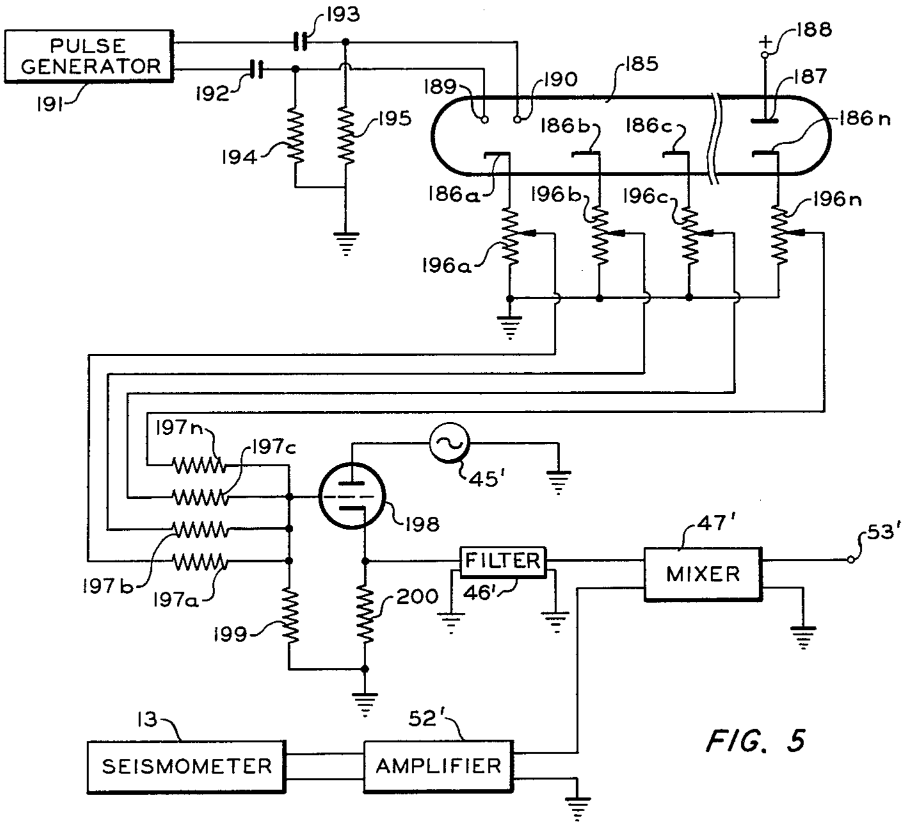
FIGURE 5 is a schematic circuit drawing of a second embodiment of the signal generating system.

In FIGURE 5 there is shown a second embodiment of a function generator which can be employed to establish a signal representative of the desired seismic amplifier gain. This function generator includes a glow transfer tube 185 which has a plurality of cathodes 186*a*, 186*b*, 186*c*, . . . 186*n* and a single anode 187, the latter being connected to a positive potential source 188. Tube 185 is provided with a pair of electrodes 189 and 190 which serve to transfer the discharge between adjacent cathodes. These two electrodes are energized from a pulse generator 191 which can advantageously be a multivibrator. The anodes of the two tubes in the multivibrator are connected through respective capacitors 192 and 193 to glow transfer electrodes 189 and 190. These two electrodes are connected to ground through respective resistors 194 and 195. The cathodes 186*a*, 186*b*, 186*c* . . . 186*n* of tube 185 are connected to ground through respective potentiometers 196*a*, 196*b*, 196*c* . . . 196*n*. The contactors of these potentiometers are connected through respective isolating resistors 197*a*, 197*b*, 197*c*, . . . 197*n* to the control grid of a triode 198. The control grid of triode 198 is connected to ground through a resistor 199. The anode of triode 198 is connected to the first terminal of a current source 45′ which corresponds to current source 45 of FIGURE 3. The second terminal of source 45′ is connected to ground. The cathode of triode 198 is connected to ground through a resistor 200. The cathode of triode 198 is also connected through a smoothing filter 46′ to the first input terminal of a mixer 47′. The output of seismometer 13′ is applied through an amplifier 52′ to the second input of mixer 47′.

The contactors of potentiometers 196*a*, 196*b*, 196*c* . . . 196*n* are set in accordance with the desired sequential amplitudes of the amplifier gain control signal. As the discharge is transferred between adjacent cathodes of tube 185, potentials appear in the contactors of these potentiometers which are representative of these sequential amplitudes. These potentials are in turn applied to the control grid of triode 198 which conducts during alternate half cycles of the applied potential from source 45′. The amount of conduction depends on the potential applied to the control grid so that the output signal from the cathode varies in amplitude in accordance with the settings of the potentiometers. This serves to establish a gain control signal for the seismometer.

Figure 6:
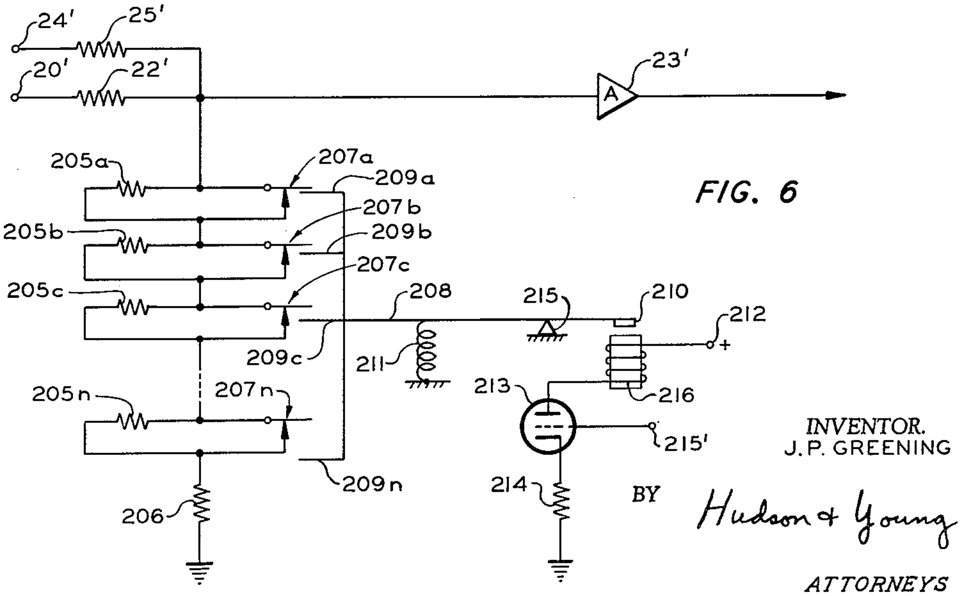
FIGURE 6 is a schematic circuit drawing of a second embodiment of the amplifier gain control apparatus.

In FIGURE 6 there is shown a second embodiment of a servo system which can be employed in place of motor 36 in the apparatus of FIGURE 2. Adjustable resistor 40 of FIGURE 2 is represented by a plurality of series connected resistors 205*a*, 205*b*, 205*c* . . . 205*n* which are connected between the input of amplifier 23′ and the first terminal of a resistor 206. The second terminal of resistor 206 is connected to ground. Resistors 205*a*, 205*b*, 205*c*, . . . 205*n* are shunted by respective normally closed switches 207*a*, 207*b*, 207*c*, . . . 207*n*. These switches are adapted to be opened in sequence by a lever 208 which is provided with arms 209*a*, 209*b*, 209*c*, . . .

209*n* on the first end thereof. Lever 208 is mounted on a pivot point 215, and is provided with a member of magnetic material 210 at the second end thereof. This member is adapted to be attracted by a coil 216 so as to pivot the lever about point 215 to raise the arms and thereby open the associated switches. Arm 209*a* is relatively close to switch 207*a*, and each of the lower arms is progressively farther away from its associated switch. Thus, an initial rotation of the lever opens switch 207*a*, and further rotation opens the additional switches in sequence. As the additional switches are opened, the resistance between the input of amplifier 23′ and ground is increased.

The arms of lever 208 normally are retained out of engagement with the switches by means of a bias spring 211. The first terminal of coil 216 is connected to a positive potential source 212, and the second terminal of the coil is connected to the anode of a triode 213. The cathode of triode 213 is connected to ground through a resistor 214. The control grid of triode 213 is connected to a terminal 215′ which can represent the output terminal of the error detector circuit 32 of FIGURE 2. This error signal thus controls the current through triode 213 and coil 216 which determines the force by which member 210 is attracted against the force of spring 211 and thereby the number of switches which are opened. In this manner, the gain of the amplifier is regulated by adjusting the amount of the input signal to amplifier 23′ which is shunted to ground.

From the foregoing description it should be evident that an improved seismic amplifier gain control system is provided in accordance with this invention. This system permits the amplifier gain to be adjusted as a function of time in any selected manner.

While the invention has been described in conjunction with present preferred embodiments, it obviously is not limited thereto.

What is claimed is:

1. A seismic signal recording system comprising a seismometer to establish a first electrical signal representative of vibrations incident thereon; an amplifier; a recorder; means to generate an alternating second electrical signal of amplitude which varies in a preselected manner and which is of a frequency different from the output signal of said seismometer when said seismometer is subjected to seismic vibrations; means to combine said first and second signals and to apply the combined signal to the input of said amplifier; first filter means connected between the output of said amplifier and said recorder to block signals of the frequency of said second signal and to transmit signals of the frequency of said first signal to actuate said recorder; means to adjust the gain of said amplifier comprising a source of reference direct potential, means to rectify an alternating signal, means to compare said direct potential with the output of said means to rectify, a multi-contact relay, a resistance network connected to said amplifier so that the gain thereof is a function of the resistance of said network, means connecting said network to said relay so that the resistance of said network is a function of the number of contacts of said relay which are open, and means responsive to said means to compare to adjust the number of said contacts which are open; and second filter means connected between the output of said amplifier and the input of said means to rectify to block signals of the frequency of said first signal and to transmit signals of the frequency of said second signal to energize said means to adjust, whereby the gain of said amplifier is a function of the amplitude of said second signal.

2. The recording system of claim 1 wherein said means to generate said second signal comprises a potentiometer, a source of alternating current applied across the end terminals of said potentiometer, and means to adjust the position of the contactor of said potentiometer in a predetermined manner, the potential between the contactor and one end terminal of said potentiometer representing said second signal.

3. The recording system of claim 1 wherein said means to generate said second signal comprises a glow transfer tube having an anode and a plurality of cathodes, a plurality of potentiometers connected in the cathode circuits of said tube, the settings of the contactors of said potentiometers representing predetermined sequential amplitudes of said second signal, means to transfer a discharge through said tube between said anode and adjacent cathodes, a source of alternating current, means to establish a signal representative of said source of alternating current, and means responsive to the potentials at the contactors of said potentiometers to vary said means to establish.

4. A seismic signal recording system comprising a seismometer to establish a first electrical signal representative of vibrations incident thereon; an amplifier; a recorder; means to generate an alternating second electrical signal of amplitude which varies in a preselected manner and which is of a frequency different from the output signal of said seismometer when said seismometer is subjected to seismic vibrations; means to combine said first and second signals and to apply the combined signal to the input of said amplifier; first filter means connected between the output of said amplifier and said recorder to block signals of the frequency of said second signal and to transmit signals of the frequency of said first signal to actuate said recorder; means to adjust the gain of said amplifier comprising a source of reference direct potential, means to rectify an alternating signal, means to compare said direct potential with the output of said means to rectify, a plurality of resistors connected in series relationship, means connecting said resistors to said amplifier so that the gain thereof is determined by the total resistance of said resistors connected in series, a relay having a plurality of contacts, means responsive to said means to compare to energize said relay to adjust the number of said contacts which are open, and means connecting said contacts in parallel with respective ones of said resistors; and second filter means connected between the output of said amplifier and the input of said means to rectify to block signals of the frequency of said first signal and to transmit signals of the frequency of said second signal to energize said means to adjust, whereby the gain of said amplifier is a function of the amplitude of said second signal.

References Cited in the file of this patent

UNITED STATES PATENTS

| | | |
|---|---|---|
| 2,037,107 | Abraham | Apr. 14, 1936 |
| 2,067,519 | Cole | Jan. 12, 1937 |
| 2,349,186 | Merten | May 16, 1944 |
| 2,374,008 | Godsey | Apr. 17, 1945 |
| 2,424,705 | Parr | July 29, 1947 |
| 2,426,035 | Lindbeck | Aug. 19, 1947 |
| 2,428,595 | Valentine | Oct. 7, 1947 |
| 2,493,534 | Hawkins | Jan. 3, 1950 |
| 2,558,439 | Hurault | June 26, 1951 |
| 2,723,387 | Slavin | Nov. 8, 1955 |
| 2,838,742 | McManis | June 10, 1958 |
| 2,934,741 | Gray | Apr. 26, 1960 |